(12) United States Patent
Wong et al.

(10) Patent No.: US 8,643,159 B2
(45) Date of Patent: Feb. 4, 2014

(54) LEAD FRAME WITH GROOVED LEAD FINGER

(75) Inventors: Wai Keong Wong, Shah Alam (MY); Kok Leong Chan, Subang (MY); Wei Kee Chan, Kuala Lumpur (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/441,924

(22) Filed: Apr. 9, 2012

(65) Prior Publication Data

US 2013/0264693 A1    Oct. 10, 2013

(51) Int. Cl.
*H01L 23/495* (2006.01)

(52) U.S. Cl.
USPC ............................................ 257/676; 257/99

(58) Field of Classification Search
USPC .................................................. 257/676, 99
See application file for complete search history.

(56) References Cited

U.S. PATENT DOCUMENTS

| | | |
|---|---|---|
| 5,358,906 A | 10/1994 | Lee |
| 5,960,262 A | 9/1999 | Torres |
| 6,197,615 B1 | 3/2001 | Song |
| 7,073,702 B2 | 7/2006 | Fitzsimmons |
| 7,413,934 B2 | 8/2008 | Tellkamp |
| 7,728,443 B2 | 6/2010 | Hembree |
| 7,745,322 B2 | 6/2010 | Lee |
| 2008/0286959 A1 | 11/2008 | Chia |
| 2010/0203683 A1 | 8/2010 | Lee |
| 2011/0057299 A1 | 3/2011 | Takata |

FOREIGN PATENT DOCUMENTS

JP          05136198        *   6/1993

* cited by examiner

*Primary Examiner* — Long Pham
(74) *Attorney, Agent, or Firm* — Charles Bergere

(57) ABSTRACT

A lead finger of a lead frame has a number of channels or grooves in a portion of its top surface that provide a locking mechanism for securing a bond wire to the lead finger. The bond wire may be attached to the lead finger by stitch bonding.

11 Claims, 4 Drawing Sheets

LEAD FRAME WITH GROOVED LEAD FINGER

BACKGROUND OF THE INVENTION

The present invention relates generally to semiconductor devices, and more particularly to a lead frame having a grooved tip for securing a bond wire to the tip.

Wire bonding technology is used for connecting bond wires between a semiconductor die and lead fingers of a lead frame or substrate electrical connection pads. The wire bonding process includes feeding the bond wire through a capillary of a wire bonding device and using the capillary to facilitate the bonding of the wire to the die and the lead frame or substrate.

FIG. 1 is a cross-sectional view of a conventional semiconductor device 10 having a semiconductor die 12, a lead frame 14 having a die flag 16 and lead fingers 18 surrounding the die flag 16, bond wires 20 extending between the die 12 and the lead fingers 18, and a molding compound 22 that encapsulates the semiconductor die 12 and bond wires 20.

In the assembly process, the bond wires 20 are attached and electrically connected to bond pads of the die and ends of the lead fingers (or substrate) with a wire bonding machine by applying ultrasonic pressure and heat. For example, a bond wire is threaded through a capillary and then a free end of the bond wire is first melted to form a free air ball (FAB). The FAB is attached to the die bond pad by pressing the FAB against a die bond pad and applying thermal and ultrasonic energy. The bond wire 20 is then moved to the surface of a respective lead finger 18 of the lead frame 14 using the wire bonding device and then pressed onto the surface of the lead finger 18 again by applying ultrasonic and thermal energy. Once the wire 20 is attached to the lead finger 18, the capillary pulls on and breaks the wire 20 from the lead finger 18 and then the process is repeated with the capillary going from die bond pad to lead finger.

FIG. 2 is an illustration of the bond wire 20 being attached to a lead finger or the lead frame 14 with a capillary 30. This bond usually is called a stitch bond 32. The bond to the die bond pad sometimes is referred to as the first bond and the bond to the lead finger as the second bond. One problem in semiconductor device assembly is a poor second bond. That is, a stitch bond generally is not as reliable as a ball bond. For example, For example, the second bond FIGS. 3, 4 and 5 are photographs of poor or compromised second bonds. FIG. 3 is a picture 40 of a broken stitch bond 42 that was damaged when the substrate was subjected to an open/short failure test. FIG. 4 is a picture 44 of a broken stitch bond 46 that was damaged in a similar manner. FIG. 5 is a picture 48 of two stitch bonds 50 and 52 having heel cracks.

Accordingly, it would be advantageous to be able to form a more reliable second bond and have a semiconductor device with more reliable second bonds.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "having," "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. Also, the terms stitch bond and second bond have been used interchangeably in this specification.

In one embodiment, the present invention provides a method of wire bonding. A substrate having a plurality of channels formed on a substrate electrical connection pad of the substrate is provided. A stitch bond of a wire is formed on the substrate such that a first end of the wire is embedded within the plurality of channels of the substrate.

In another embodiment, the present invention is a semiconductor device. The semiconductor device includes a substrate having a plurality of channels formed on a substrate electrical connection pad. A semiconductor die is attached to a die-attach area of the substrate and bond wires are electrically coupled to the substrate and to the semiconductor die. An end of each bond wire is embedded within the channels of the substrate to form a secure bond on the substrate electrical connection pad.

Figure 1:
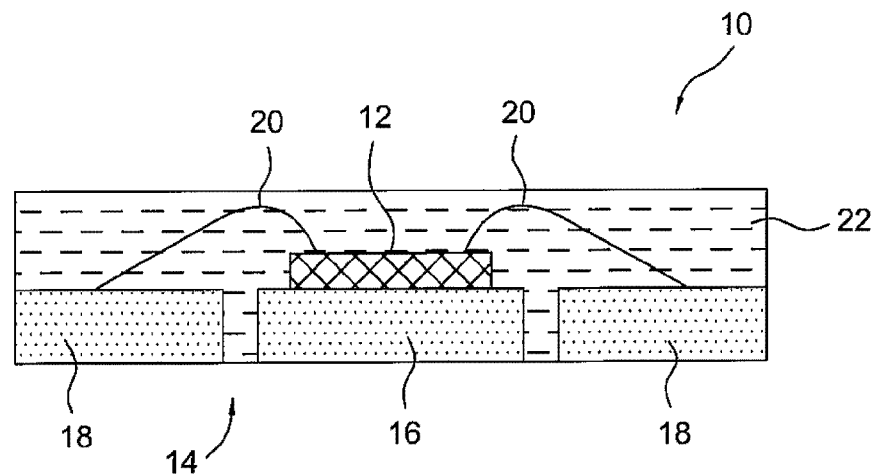
FIG. 1 is an enlarged cross-sectional, side view of a conventional semiconductor package.
Figure 2:
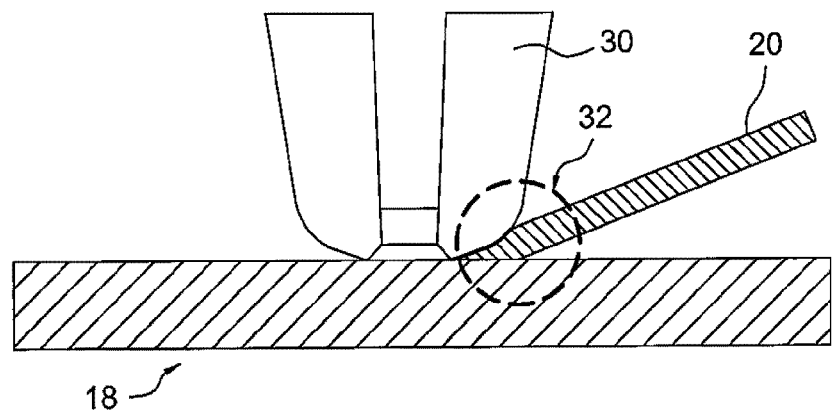
FIG. 2 illustrates the formation of a conventional stitch bond or second bond.
Figure 5:
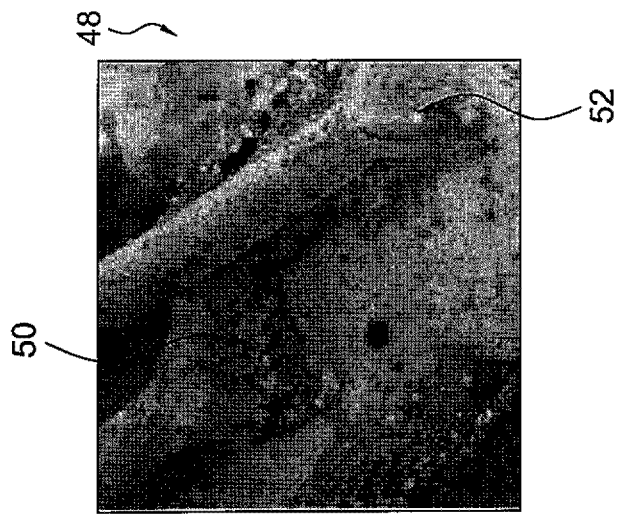
FIG. 5 is a photograph of a stitch bond formed using a conventional bonding process after being subjected to an open/short failure test.
Figure 4:
FIG. 4 is another photograph of a broken stitch bond that was formed using a conventional bonding process after being subjected to an open/short failure test.
Figure 3:
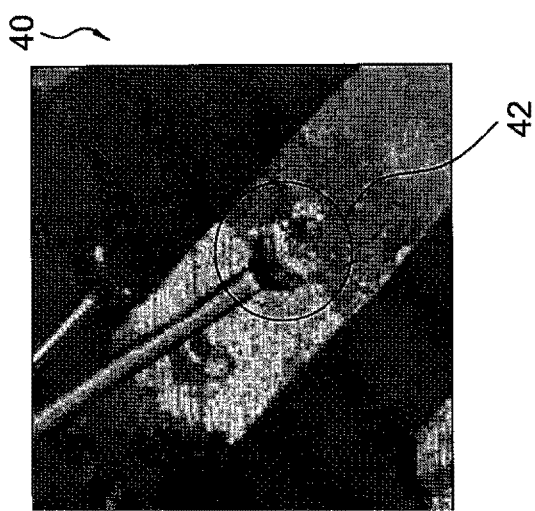
FIG. 3 is a photograph of a broken stitch bond that was formed using a conventional bonding process after being subjected to an open/short failure test.
Figure 6:
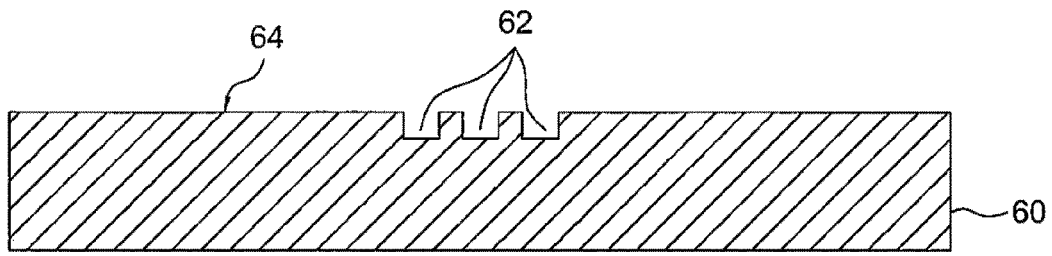
FIG. 6 is a side cross-sectional view showing a substrate with channels formed on a substrate electrical connection pad of the substrate in accordance with an embodiment of the present invention.

Referring now to FIG. 6, a side cross-sectional view of a substrate 60 is illustrated. In the illustrated embodiment, the substrate 60 includes a plurality of channels 62 formed on a substrate electrical connection pad 64 of the substrate 60. The substrate 60 may be a printed circuit board (PCB), a flexible circuit board, or a lead frame. When the invention is embodied in a lead frame, the plurality of channels 62 are formed in lead fingers of the lead frame, and more particularly, in the position on the lead finger where a bond wire is attached to the lead finger, typically proximate to one end of the lead finger. Each of the plurality of channels 62 has a generally rectangular shape. However, other shapes may be envisaged.

In this exemplary embodiment, the substrate 60 includes three vertical channels 62. More or fewer of the channels 62 may be formed on the substrate 60. In certain embodiments, the number of the channels 62 is from one (1) to about three (3).

The plurality of channels 62 may be formed on the substrate 50 using a chemical etching process, which is known in the art. Other techniques that may be used for forming the channels 52 include a laser machining process, an ion milling process, a mechanical process such as stamping, or combinations thereof. Such techniques are well known and thus detailed descriptions thereof are not necessary for a complete understanding of the present invention.

In the illustrated embodiment, each channel 62 has a width of about 5 to 15 microns and a depth of about 5 to 15 microns. The depth of the channel 62 depends on the depth of the substrate electrical connection pad 64. For example, if the too many channels are formed too deeply in the connection pad 64, wire bounce may be experienced during the wire bonding process.

Figure 7:
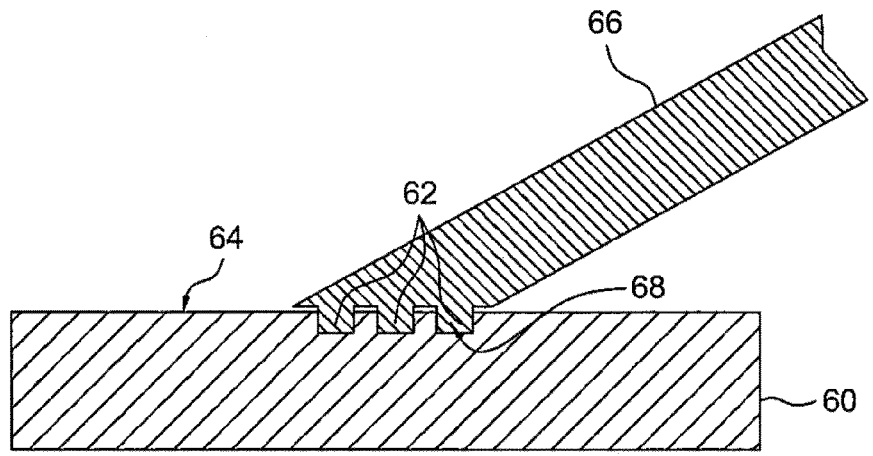
FIG. 7 is a side cross-sectional view of the substrate of FIG. 6 with a bond wire attached thereto.

FIG. 7 is a side cross-sectional view of the substrate 60 with one end of a bond wire 66 attached to the substrate electrical connection pad 64. The bond wire 66 may be formed of gold, aluminum, or copper, as is known in the art, and may be bare, plated, or coated. During the wire bonding process, when the second bond is formed, as illustrated, a first end 68 of the bond wire 66 is embedded within the channels 62. The second bond formed by embedding the bond wire 66 within the channels 62 of the substrate 60 increases the contact surface area between the wire and the substrate, and also provides an anchor-locking mechanism thereby improving the strength of the second bond.

As will be appreciated by those skilled in the art, another end of the bond wire 66 may be attached to a bond pad of a semiconductor die (not shown), whereby the wire forms an electrical connection between the die and the substrate/lead finger. The bond wire 66 may be coupled to the respective bond pad of the semiconductor die by ball bonding, as is known in the art.

Figure 8:
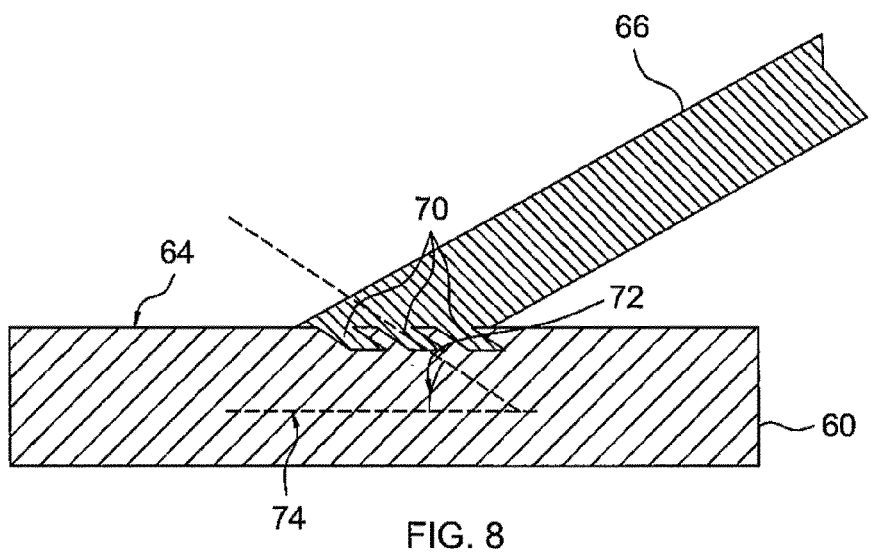
FIG. 8 is a side cross-sectional view of a substrate with a bond wire attached thereto in accordance with another embodiment of the present invention.

FIG. 8 is a side cross-sectional view of the substrate 60 and substrate electrical connection pad 64 with a plurality of channels 70 formed in a surface of the connection pad 64. In this embodiment, the channels 72 are oriented at an angle 72 relative to a longitudinal axis 74 of the substrate 60. In this example embodiment, the angle 72 is in a range from about 30° to 90°, and in the embodiment shown, the angle 72 is about 30° degrees. FIG. 8 also shows the bond wire 66 attached to the connection pad 64, such as by stitch bonding, with the end of the wire 66 being embedded with the channels 70.

Figure 9:
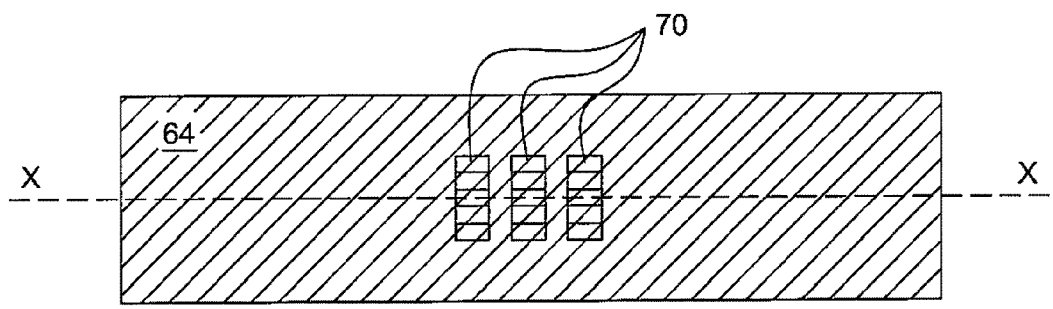
FIG. 9 is a top plan view of a substrate electrical connection pad in accordance with an embodiment of the present invention.

Referring now to FIG. 9, a top plan view of the substrate connection pad 64 in accordance with an embodiment of the present invention is shown. In this embodiment, the substrate connection pad 64 has nine (9) channels 70 formed in its top surface. The channels 70 may be formed as three channels that extend perpendicular to the line X-X shown in the drawing, where the line X-X indicates the direction of a wire 66 when attached to the connection pad 64. Alternatively, as shown, the channels 70 may be formed as nine (9) separate channels arranged in an array formation. It will be understood that there may be more or less than three rows and/or three columns of channels, depending on the wire diameter and connection pad size. In the embodiment shown, the channels 70 have dimensions of L×W×D each of about 5~15 microns. In one alternate embodiment of the invention, the channels comprise micro-dimples formed in the surface of the substrate connection pad/lead finger. The micro-dimples are sized and shaped to allow the bond wire to be embedded within the dimples so that a strong and reliable second bond is formed. In one example, the micro-dimples are 5~15 microns and are formed as an array in the surface of the connection pad/lead finger.

The present technique of forming a stitch bond may be utilized in packaging a semiconductor die. The semiconductor package may include a substrate having channels as described above on a substrate electrical connection pad. A semiconductor die such as an integrated circuit may be attached to a die attach area of the substrate using a die-attach adhesive like epoxy. The semiconductor die then may be electrically coupled to the substrate using bond wires. The bond wires may be attached to the die bond pads and the substrate connection pads using wire bonding equipment. The bond wires are ball bonded to the bond pads of the semiconductor die and attached to the substrate connection pads (or lead fingers) by embedding the ends of the wires within the channels therein to form a good, reliable second bond. A molding compound such as epoxy may be subsequently dispensed onto the substrate to cover the semiconductor die and the electrical connections thereto to form the semiconductor package.

The present invention, as described above, allows for forming a high quality stitch bond between bond wires and substrate electrical connection pads of a substrate in semiconductor packages. The present wire bonding technique may be utilized for any leadframe or substrate packages that require wire bonding. The stitch bond formed using the above described process provides for relatively large bond contact surface area with a locking mechanism for locking the bond wires thereby enhancing the robustness and package reliability to withstand stresses during mounting of such packages on board and other customer applications.

By now it should be appreciated that there has been provided an improved packaged semiconductor device and a method of forming the packaged semiconductor device. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A semiconductor device, comprising:
a substrate having a die flag and a plurality of substrate electrical connection pads, wherein the substrate electrical connection pads include a plurality of channels formed in a top surface thereof, wherein the plurality of channels are oriented at an angle of about 30° relative to a longitudinal axis of the substrate;
a semiconductor die attached to the die flag, wherein the semiconductor die has a plurality of die bond pads on a top surface thereof; and
a plurality of bond wires electrically coupling respective ones of the substrate electrical connection pads and the die bond pads, wherein a first end of each of the bond wires is embedded within the channels formed in the top surface of the substrate electrical connection pad.

2. The semiconductor device of claim 1, wherein the plurality of channels comprise vertical channels.

3. The semiconductor device of claim 2, wherein a number of the vertical channels is from 1 to 3.

4. The semiconductor device of claim 1, wherein a width of each of the plurality of channels is in a range of about 5 to about 15 microns, and a depth of each of the plurality of channels is in a range of about 5 to about 15 microns.

5. The semiconductor device of claim 1, wherein the substrate is a lead frame and the substrate electrical connection pads are lead fingers.

6. The semiconductor device of claim 5, wherein the lead frame and bond wires are formed of Copper.

7. The semiconductor device of claim 1, wherein the channels comprise a plurality of micro-dimples.

8. A lead frame for a semiconductor device, the lead frame comprising:
a flag area for receiving a semiconductor die; and
a plurality of lead fingers that surround the flag, wherein tips of the lead fingers for receiving a bond wire include a plurality of channels formed in a surface thereof so that when a wire is bonded to the lead finger tip, an end of the wire is embedded within the channels, wherein the channels are formed at an angle of about 30° relative to the surface of the lead finger tip.

9. The lead frame of claim 8, wherein the lead frame is formed of Copper.

10. The lead frame of claim 8, wherein the channels have a length of about 5 microns to 15 microns and a width of about 5 microns to about 15 microns and are formed as an array of channels.

11. The lead frame of claim 8, wherein the channels comprise a plurality of micro-dimples.

* * * * *